(12) United States Patent
Lockwood et al.

(10) Patent No.: US 6,974,417 B2
(45) Date of Patent: Dec. 13, 2005

(54) ULTRASOUND TRANSDUCER ARRAY

(75) Inventors: Geoffrey R. Lockwood, Kingston (CA); Christine E. Morton, Kingston (CA)

(73) Assignee: Queen's University at Kingston, Kingston (CA)

( * ) Notice: Subject to any disclaimer, the term of this patent is extended or adjusted under 35 U.S.C. 154(b) by 0 days.

(21) Appl. No.: 10/263,683

(22) Filed: Oct. 4, 2002

(65) Prior Publication Data

US 2003/0067249 A1 Apr. 10, 2003

Related U.S. Application Data

(60) Provisional application No. 60/326,995, filed on Oct. 5, 2001.

(51) Int. Cl.[7] .................................................. A61B 8/00
(52) U.S. Cl. ....................................................... 600/459
(58) Field of Search ................................ 600/443, 447, 600/459; 128/916; 73/625–626; 340/334, 340/336, 366–368

(56) References Cited

U.S. PATENT DOCUMENTS

| | | | | |
|---|---|---|---|---|
| 4,131,023 A | * | 12/1978 | Mezrich et al. ................ | 73/606 |
| 4,157,665 A | * | 6/1979 | Bridoux et al. ............... | 73/607 |
| 4,207,772 A | * | 6/1980 | Stoller ......................... | 73/620 |
| 4,241,611 A | * | 12/1980 | Specht et al. ................. | 73/626 |
| 4,242,912 A | * | 1/1981 | Burckhardt et al. .......... | 73/626 |
| 4,344,159 A | * | 8/1982 | Ballinger ..................... | 367/87 |
| 4,448,075 A | * | 5/1984 | Takemura et al. ............ | 73/626 |
| 4,870,867 A | * | 10/1989 | Shaulov ....................... | 73/625 |
| 5,167,231 A | * | 12/1992 | Matsui ......................... | 600/459 |
| 5,311,095 A | * | 5/1994 | Smith et al. ................. | 310/334 |
| 5,844,349 A | * | 12/1998 | Oakley et al. ............... | 310/358 |
| 6,429,574 B1 | * | 8/2002 | Mohr et al. .................. | 310/334 |

OTHER PUBLICATIONS

Cochran, A., et al., "Flaw monitoring using ultrasonic arrays in-situ." Condition Monitoring and Diagnostic Technology 1:119-129 (1991).

Hayward, G., et al., "New ultrasonic array structure for fixed condition monitoring in solid media." Ultrasonics 27:210-220 (1989).

Kirk, K.J., et al., "An array-based system for monitoring cracks in industrial plant at high temperatures." Insight 38:722-727 (1996).

Kirk, K.J., et al., "Ultrasonic arrays for monitoring cracks in an industrial plant at high temperatures." IEEE Transactions on Ultrasonics, Ferroelectrics, and Frequency Control 46: 311-319 (1999).

* cited by examiner

Primary Examiner—Francis J. Jaworski
(74) Attorney, Agent, or Firm—Stephen J. Scribner; Carol Miernicki Steeg

(57) ABSTRACT

This invention relates to an ultrasonic transducer array for non-destructive imaging and inspection of materials, suitable for applications such as bio-medical imaging. According to the invention, the transducer has at least one electrode comprising an array of electrode elements, wherein the elements are not separated by a grooves or kerfs. The grooveless transducer design simplifies transducer construction and permits very high operating frequencies, and hence very high resolution. In one embodiment suitable for producing real-time high resolution 3-dimension images, the invention provides a hybrid transducer comprising two opposed electrodes, one electrode being a grooveless linear array and the second electrode being a grooved linear phased array.

33 Claims, 10 Drawing Sheets

A

A

B

Matching Layer | Substrate | Backing Layer | Electrode

ULTRASOUND TRANSDUCER ARRAY

RELATED APPLICATIONS

This application claims the benefit of the filing date of U.S. Provisional Patent Application Ser. No. 60/326,995, filed on Oct. 5, 2001, the contents of which are incorporated herein by reference in their entirety.

FIELD OF THE INVENTION

This invention relates generally to an ultrasound transducer and more specifically to an ultrasound transducer array.

BACKGROUND OF THE INVENTION

Ultrasound imaging is a well established tool for medical diagnosis and nondestructive testing and inspection of materials. Ultrasound imaging systems use transducers to create short high frequency acoustic pulses. The acoustic pulses propagate into the object under investigation. At locations where there is a change in acoustic properties, such as the boundary between two different tissue layers, part of the ultrasound energy is reflected. The reflected echos are detected by the transducer and processed to produce a two dimensional image of the underlying structures. The ability of the imaging system to detect small or subtle structures is primarily determined by the ability of the transducer to focus the ultrasound energy. Focusing the ultrasound beam can be achieved by shaping the transducer, by using an acoustic lens, or by using an array of transducers. Most modern ultrasound imaging systems employ transducer arrays.

The ultrasound energy produced by an array is focused by introducing time delays to the signals delivered to (or received from) individual array elements so that signals transmitted to (or received from) the desired region in space constructively interfere while signals outside this region destructively interfere. How well an array achieves this constructive interference is determined by the radiation pattern of the array. The radiation pattern can be visualized as a plot of the amplitude of the signal transmitted or received by the array as a function of position in space. An example of a radiation pattern is shown in FIG. 1, where the radiation pattern has been plotted as a contour plot using a logarithmic scale (dB) normalized to the peak pressure. The peak in the radiation pattern corresponds to the desired region in space over which the energy will be transmitted and from which the energy will be received. The width of the main peak in the radiation pattern is inversely proportional to the width of the array and determines the resolution of the imaging system. The non-zero amplitude of the radiation pattern away from the peak is caused by imperfect destructive interference and results in transmission and reception of unwanted energy. Transducer arrays are designed with the goal of obtaining a peak in the radiation pattern that is as narrow as possible while minimizing the amplitude of energy in the radiation pattern away from the main peak.

Ultrasound transducer arrays are fabricated by cutting a series of narrow grooves or kerfs through a bulk transducer substrate such as lead zirconate titanate (PZT). The grooves are used to mechanically and electrically isolate the array elements. To provide mechanical support to the narrow array elements, the grooves are often filled with a soft polymer material. The resulting array is essentially a composite structure consisting of alternating layers of PZT ceramic and polymer. Transducer arrays have also been fabricated by forming an electrode pattern on the surface of a ceramic-polymer composite fabricated using other methods, or on a polymer transducer substrate such as poly(vinylidene fluoride) (PVDF).

The grooves or kerfs of most ceramic arrays are machined using a thin diamond wheel. Other machining techniques such as laser machining or ultrasonic machining have also been used to separate the array elements. Although these techniques work well for arrays designed to operate below 10 MHz, they are not suitable for machining the extemely small and closely spaced elements required for high frequency imaging. They are also difficult to use with new single crystal relaxor ferroelectric materials such as lead zirconate niobate-lead titanate (PZN-PT) and lead magnesium niobate-lead titanate (PMN-PT) which are brittle and prone to chipping and cracking.

SUMMARY OF THE INVENTION

According to a first aspect of the invention there is provided a transducer for transmitting and/or receiving ultrasound energy, comprising a hard substrate having first and second opposed faces; a first electrode disposed on said first face, said first electrode comprising an array of electrode elements; and a second electrode disposed on said second face; wherein said first electrode lacks grooves in said substrate between said electrode elements. In various embodiments, the substrate is of a material selected from piezoelectric ceramic, ferroelectric ceramic, and single crystal relaxor ferroelectric materials. In a preferred embodiment, the substrate is of PZT material.

In further embodiments, the transducer further comprises at least one matching layer disposed over said second electrode. In one embodiment, the matching layer is silver epoxy. In a preferred embodiment, the second electrode is also a matching layer.

In further embodiments, the transducer further comprises at least one backing layer disposed over said first electrode. In a preferred embodiment, the backing layer is tungsten-loaded epoxy.

In one embodiment, said second electrode comprises an array of electrode elements. In a further embodiment, said second electrode further comprises grooves in the substrate between said electrode elements. In a preferred embodiment, said first electrode comprises a linear array and said second electrode comprises a linear phased array.

In accordance with a second aspect of the invention there is provided a method of producing a transducer for transmitting and/or receiving ultrasound energy, comprising providing a hard substrate having first and second opposed faces; disposing a first electrode on said first face, said first electrode comprising an array of electrode elements; and disposing a second electrode on said second face; wherein said first electrode lacks grooves in the substrate between said electrode elements.

In accordance with a third aspect of the invention there is provided an ultrasonic imaging system comprising a transducer as described herein and ultrasound transmitting and/or receiving circuitry.

In accordance with a further aspect of the invention there is provided a method of producing an ultrasound image of a material under investigation, comprising: (a) transmitting at least one ultrasonic pulse into a material under investigation using a transducer comprising a hard substrate having first and second opposed faces; a first electrode disposed on said first face, said first electrode comprising an array of electrode elements; and a second electrode disposed on said second face; wherein said first electrode lacks grooves in said substrate between said electrode elements; (b) receiving an echo of said at least one pulse with said transducer; and (c) processing information corresponding to said pulse and said echo to generate an image of said material.

In another embodiment, the invention provides a method of producing a 3-D ultrasound image of a material under investigation, comprising: (a) providing a transducer wherein said first electrode comprises a linear array and said second electrode comprises a linear phased array, as described above; (b) activating a first subset of said linear array elements to create a first 2-D image; (c) activating a second subset of said linear array elements to create a second 2-D image, wherein said second 2-D image is spatially adjacent to said first 2-D image; (d) repeating steps (b) and (c) n times to create n spatially adjacent 2-D images; and (e) assembling said n 2-D images to produce a 3-D image of said material under investigation.

BRIEF DESCRIPTION OF DRAWINGS

Embodiments of the invention are described below, by way of example, with reference to the accompanying drawings, wherein.

DETAILED DESCRIPTION OF THE INVENTION

According to one aspect of the invention there is provided a transducer array for transmitting and receiving ultrasonic energy, suitable for use in non-destructive imaging in, for example, bio-medical, engineering, and manufacturing applications. A transducer array according to the invention comprises a substrate having two opposed faces, a first electrode comprising an array of electrode elements formed on a first face of the substrate, a second electrode formed on the second face of the substrate, and further optional layers such as one or more matching layers and an acoustically lossy backing layer. The invention provides ultrasonic transducer arrays that can operate at frequencies as low as 100 kHz and at least as high as 500 MHz. It is expected that a transducer array of the invention can be made to operate at higher frequencies (e.g., 1 GHz); the ability to achieve such high frequency being limited by available production capabilities. The ability to operate at such high frequency makes the transducer arrays valuable for applications where high resolution imaging is required.

In accordance with the invention, the transducer substrate is a hard substrate that is an efficient resonator, and is unlike polymer substrates that are generally much softer and less efficient resonators. Suitable substrate materials include, but are not limited to, piezoelectric and ferroelectric ceramics, and single crystal materials having regular crystalline structure. Examples of such ceramic materials are lead zirconate titanate (PZT), lead titanate (PT), barium titanate (BT), barium strontium titanate (BST), sodium-potassium niobate, lithium tantalate, lead metaniobate, zinc oxide, aluminum nitride, bismuth titanate, barium strontium titanate, barium magnesium fluoride, and potassium nitrate. Examples of suitable single crystal materials are quartz and lithium niobate, and single crystal relaxor ferroelectric materials such as lead zirconate niobate-lead titanate (PZN-PT) lead magnesium niobate. (PMN), and lead magnesium niobate-lead titanate (PMN-PT). The thickness of the substrate is chosen to resonate at a desired operating (e.g., imaging) frequency, as would be apparent to one of ordinary skill in the art. For example, a PZT substrate operating at 50 MHz is about 40 $\mu$m to about 50 $\mu$m thick, preferably about 45 $\mu$m thick. The resonant frequency of a transducer will of course also depend on characteristics (e.g., thickness, type of material) of the matching layer(s) and electrodes, described below.

Figure 1:
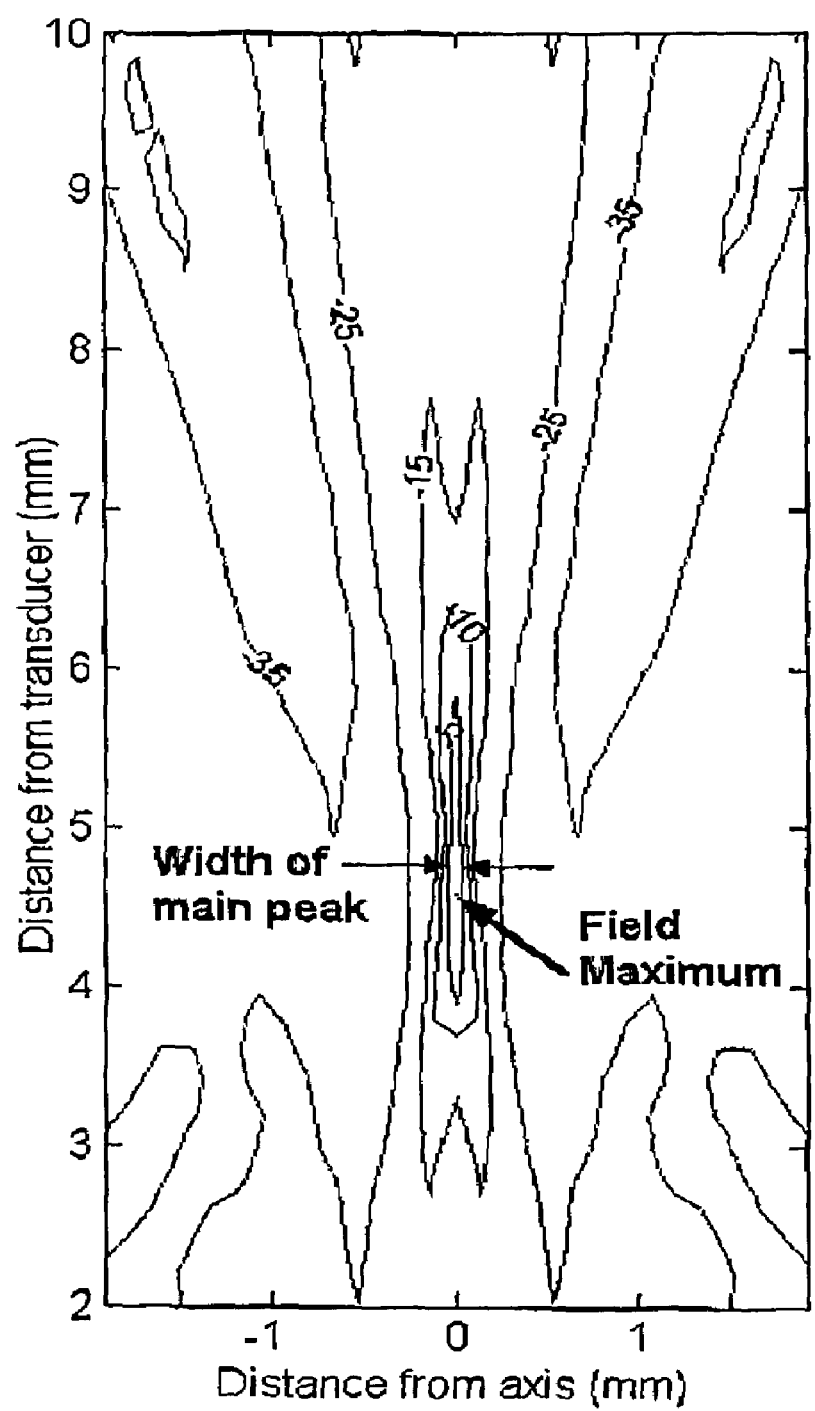
FIG. 1 shows a hypothetical radiation pattern for a transducer array.
Figure 2:
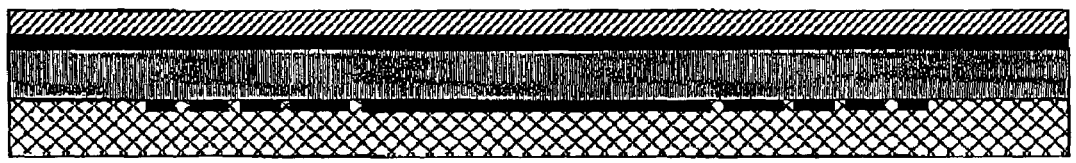
FIGS. 2A and 2B are schematic cross-sectional side views of transducer arrays according to two embodiments of the invention.
Figure 2:
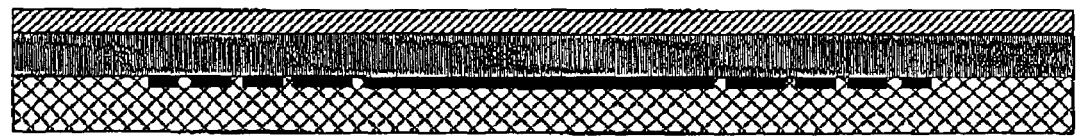

The first electrode, which comprises an array of electrode elements, is formed on one of the opposed sides of the substrate by applying a suitable material (e.g., gold) to the substrate. One or more of the elements of the electrode array is provided with a suitable electrical connection to signal transmitting and/or receiving circuitry. For example, elements can be connected to bonding pads, and gold bond wires used to connect bonding pads to the drive/receive electronics. In some embodiments the second electrode is formed on the second side of the substrate by applying a material such as gold to the substrate (FIG. 2A). In other embodiments the second electrode is formed by applying a conductive matching layer such as silver epoxy to the substrate (FIG. 2B).

Although optional, it is preferable to apply at least one matching layer, as such layer enhances coupling of the acoustic energy to the medium under investigation and hence improves the bandwidth and efficiency of the array. The matching layer can be any suitable material such as, for example, silver epoxy, gold epoxy, or epoxy, and is applied at an appropriate thickness to achieve the desired matching for a given material and operating frequency, generally about 5 $\mu$m to about 200 $\mu$m. The matching layer is applied to the electrode (either the first or second electrode) which is facing the material under investigation, preferably the second electrode. As noted above, use of a conductive material for the matching layer on the second electrode obviates the need for a metallic electrode applied to the substrate (FIG. 2B). This simplifies production in such embodiments. In embodiments where the matching layer is applied to the first electrode (i.e., the electrode array), conductive materials should not be used.

An acoustically lossy backing layer is optionally applied to the electrode not facing the material under investigation, preferably the first electrode. The backing layer material absorbs acoustic energy radiating from the surface of the electrode to which it is applied, such that most of the radiated acoustic energy is radiated from the electrode facing the material under investigation. In embodiments lacking a backing layer, air advantageously provides this function, but has the drawback that the pulse ring-down time is increased (e.g., 10 to 12 cycles vs. 1 to 2 cycles with a backing layer). The longer pulse compromises the resolution of the transducer array. For the backing layer, a material such as, for example, tungsten-loaded epoxy or alumina-loaded epoxy, with a thickness of about 0.5 to about 15 mm, is suitable.

The first electrode, which comprises the element array, is formed from a thin layer (e.g., about 500 Å to about 1.5 $\mu$m thick) of a material such as gold or an alloy of metals such as chromium and gold (Cr—Au). The array pattern is applied to a first side of the substrate using any suitable means, such as, for example, conventional evaporating or sputtering and photolithography. The second electrode can also be formed by applying a layer of electrode material to the second side of the substrate by such sputtering or evaporating techniques.

In one embodiment the transducer array is configured as a sparse array, in which certain elements of the array are used for transmitting ultrasound, and other elements of the array are used to receive ultrasound. In further embodiments the transmit and receive elements in a sparse array have different structure (e.g., geometry), each optimized for their respective transmitting and receiving functions. In a further embodiment, a transducer is configured solely for transmitting ultrasound, for use with a second transducer configured solely to receive ultrasound. The transmit and receive transducers can have the same or different array geometry. In such embodiment, a material under investigation is placed between the transmit and receive transducers.

It will be appreciated that a transducer array according to the invention lacks grooves between adjacent array elements. As used herein, the term "groove" is intended to mean a recess, channel, or kerf between electrodes of an array. Such grooves are formed by, for example, mechanical, ultrasonic, or laser machining, or chemical etching, and penetrate at least part of the way through the substrate, and usually all of the way through the substrate. A transducer array according to the invention is therefore "grooveless" or "kerfless", meaning that the substrate of the transducer lacks grooves or kerfs between electrode elements.

Rather, in a transducer array according to the invention, the elements are defined by simply the pattern of the electrodes disposed on the substrate. This represents a substantial departure from prior ultrasonic transducer arrays. That is, it is generally accepted by those skilled in the art that an array cannot be fabricated on a ceramic substrate without mechanically and electrically isolating the array elements, by providing grooves through the array substrate. It is believed that if this is not done, the signal transmitted or received by one element will influence the signal on an adjacent element and unless this unwanted coupling between elements is very small, the radiation pattern of the array will be degraded [1,2]. The present inventors have discovered that although this is true for an array that is electronically focussed and steered, it is not necessarily true for an array that is only focussed electronically. In fact, the invention demonstrates that a satisfactory radiation pattern can be achieved using a grooveless array in which the array elements are defined by the electrode pattern alone. Accordingly, the invention is applicable to all arrays that are focussed electronically and have a fixed steering angle. Examples of such arrays are annular arrays, linear arrays (i.e., 1-D arrays), curved linear arrays, 1.5-D arrays, and 2-D arrays.

As used herein, the term "1-D array" refers to an array having (N×1) discrete elements, the term "2-D array" refers to an array having (N×M) discrete elements, and the term "1.5 -D array" refers to an array having (N×M) discrete elements where N>M.

An advantage of the transducer array of the invention is that the fabrication process is substantially simplified, which in turn permits the fabrication of transducer arrays with very small geometry and capable of operating at very high frequency.

While not holding to one theory at the exclusion of others, it is believed that the performance of the inventive transducer array can be explained as follows: When a single element in an array having no grooves is excited, the neighbouring elements will also be excited, although to lesser extent. The major effect of this unwanted coupling between elements will be to make the array element appear wider than the specified electrode pattern. As the width of the radiating surface increases, the resulting ultrasound beam becomes more directed in front of the array and less energy is radiated at oblique angles. This is a serious problem for a linear phased array where the ultrasound beam is steered over a range of angles from −45 to +45 degrees. However, for an array where the steering angle is fixed at about 0+/−5 degrees, the loss of directivity is not a problem and appears to be an advantage.

In one embodiment of a transducer array of the invention, the first electrode and the second electrode each comprises an array of electrode elements. Preferably, the two arrays are of different patterns or configurations, such as, for example, two linear arrays oriented at 90 degrees to one another. In such an embodiment, the two electrode arrays are grooveless arrays as described above. Such a transducer is used to obtain multiple 2-D images of a study material, using beamforming techniques in which subsets of array elements are individually addressed to acquire each image.

In a further embodiment, the first electrode and the second electrode of the transducer each comprises an array of electrode elements, wherein one of the arrays is a grooveless array. Preferably, the two arrays are of different patterns or configurations. In a preferred embodiment, one of the arrays is a grooveless linear array, and the second array is a linear phased array having grooves or kerfs between electrode elements. An advantage of such a "hybrid" linear-linear phased array transducer is that it provides focussing and steering of the ultrasound beam in the elevation and azimuthal directions. Accordingly, this embodiment is used to create 3-D images by stepping the beam through a study material so as to obtain multiple adjacent 2-D images (i.e., sector format slices), and assembling the 2-D images to create a 3-D image. This is described in detail in Example 3, below.

Traditional ultrasound imaging systems used in applications such as bio-medical imaging provide images in a two-dimensional (2-D) format. Although synthesis of a three-dimensional (3-D) image of the anatomy based on the acquisition of multiple two-dimensional images has been attempted, the resulting images are often of poor quality. The main problem is that conventional ultrasound systems are too slow to acquire a full 3-D data set in real-time. For example, a 3-D image of the heart requires a collection of approximately 90 two-dimensional images acquired at a rate of 20 images/s. Slow image acquisition introduces the problem of how to align adjacent 2-D images collected at different times over many different cardiac cycles. The patient and imaging probe can be immobilized to minimize movement between adjacent images and cardiac and respiratory gating can also be used [11]. Unfortunately, even in a carefully controlled situation the resulting 3-D data set is often badly distorted and is of little use.

The ability of an imaging system to detect small or subtle structures is primarily determined by the ability of a transducer to focus the ultrasound energy. Many beamforming techniques have been developed to optimally focus and steer the ultrasound beam to produce high resolution images. A conventional sector format image is created with a linear phased array by beamforming along each line in the image. On transmit the ultrasound is steered to a certain angle, and focussed to a single depth in the tissue by applying appropriated delays across the array. On receive, a delay pattern is applied again to steer the beam along the same angle as for transmit. As the pulse is reflected at different depths in the sample material, the delays applied to the receive signal are dynamically changed to sweep the focus through the material. This dynamic focussing produces a scan line focussed along its complete length. To improve the resolution of the image, multiple transmit focal zones can be used for each scan line.

The time to create an image depends on the number of scan lines, the number of transmit focal zones, and the time for one transmit-receive event. For a typical imaging system, the image is composed of 200 scan lines in a 90 degree sector image, and uses a single transmit focal zone. For example, for typical cardiac imaging the ultrasound penetrates to a depth of about 15 cm and the speed of sound in tissue is about 1500 m/s, giving a round trip transit time of 200 ms. Therefore, the time required to acquire a single 2-D image is 200×200 ms=40 ms, which limits the frame rate to 25 frames/s. This is fast enough for real-time 2-D imaging, but too slow to image a volume a volume of interest in real-time. Images can be created more rapidly by reducing the number of scan lines, however the resolution is then reduced.

The time to produce an image can be reduced while retaining sufficient resolution by using a synthetic aperture approach. The imaging speed of such a system can be increased by using a sparse transmit array, which minimizes the number of transmit pulses and maximizes the amount of information that can be collected [12]. Such a system having only 5 transmit elements can provide a frame rate up to 1000 frames/s. Alternatively, the imaging speed can be increased by forming multiple simultaneous transmit beams. By mechanically rocking or translating the array, it is possible to create a 3-D image of aligned 2-D slices in real-time; however, the motion creates unwanted noise and vibration.

An alternative approach to real-time 3-D imaging uses a 2-D transducer array to scan and focus the ultrasound beam through the tissue volume [13,14]. A wide transmit beam is used and many receive scan lines can be formed simultaneously. While there is still a trade-off between acquisition time and resolution, the beams are formed over a volume, permitting real-time beamforming. A major problem with this approach is the large number of elements associated with a 2-D array. For example, over 16,000 elements are required to obtain the same 2-D resolution of a conventional 128 element linear phased array. This requires extensive electronics for beamforming the signal from each element. Another problem with a full 2-D array is that the elements are ½ wavelength, which is, for example, 150 mm×150 mm for a 5 MHz array. The electrical impedance of the elements is very high and the efficiency low because of the minute size of the elements.

In contrast, the invention can provide a transducer array that permits real-time 3-D imaging using far fewer elements than the 2-D array approach while avoiding the need to mechanically translate the transducer. Real-time 3-D imaging is possible because the array is able to electronically scan and focus the ultrasound beam through a complete imaging volume in the time normally required to collect a single 2-D image using a conventional system. According to this embodiment, the invention comprises a 2-D array for real-time 3-D imaging wherein a kerfless linear array is combined with a conventional diced linear phased array.

In accordance with another aspect of the invention there is provided a method of producing a transducer array. The method comprises providing a hard substrate having two opposed faces, disposing an electrode array having electrode elements on one of the faces of the substrate, and disposing an electrode on the second face of the substrate, wherein the substrate lacks grooves between electrode elements. Heretofore, methods used to produce ultrasound transducer arrays on hard substrates included providing grooves between adjacent electrode elements, which is the most difficult part of the fabrication process. By eliminating this step, the invention provides a simplified method of producing ultrasound transducer arrays. Further, the provision of grooves on hard substrates is considered to be the limiting factor in providing very high frequency transducers. The invention overcomes this limitation, thus allowing the fabrication of transducer arrays operating at much higher frequencies than was previously possible. In fact, the maximum operating frequency of a transducer array according to the invention is limited only by the available technology for disposing on a substrate electrode elements having very small geometries.

In accordance with another aspect of the invention there is provided a nondestructive ultrasonic imaging system comprising an ultrasonic transducer array as described herein, and appropriate ultrasound transmit/receive circuitry. The system may further comprise means for processing signal information. The imaging system can be configured for operation at low frequencies, e.g., 100 kHz, up to very high frequencies, e.g., 500 MHz or higher, subject to the ability to provide an ultrasonic transducer array capable of operating at such high frequency. As discussed above, the invention provides the basis for such high frequency transducers, the production of which might be limited by the available technology. Of course, the operating frequency of the imaging system is chosen to provide the desired resolution for the material under investigation. In many biomedical imaging applications, for example, a resolution of less than 20 $\mu$m is desirable, and can be achieved with an imaging system in accordance with the invention.

All cited publications are incorporated herein by reference in their entirety.

The invention is further described below by way of the following non-limiting Examples.

EXAMPLE 1

Figure 3:
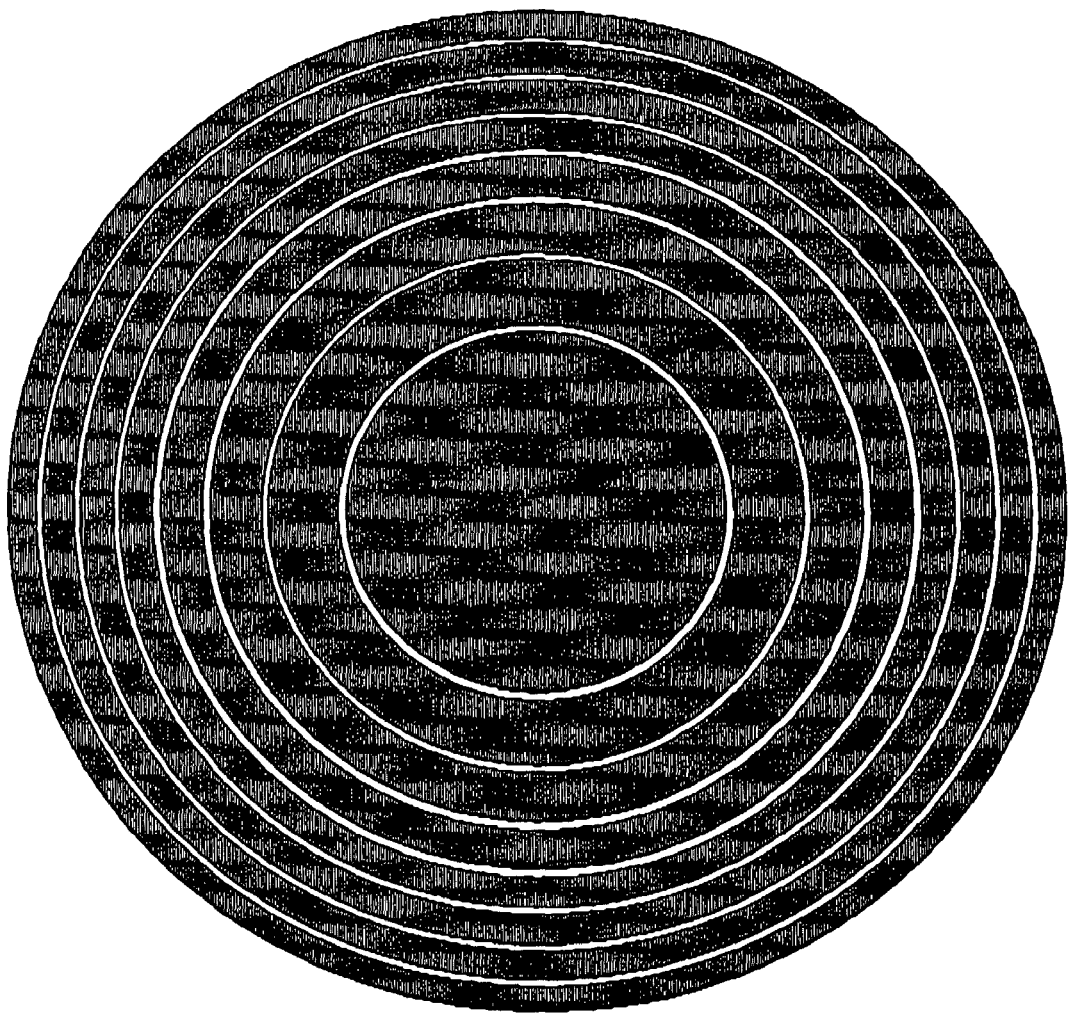
FIG. 3 shows an electrode pattern for an annular array operating at 50 MHz according to the invention.

With reference to FIG. 2B, a high frequency (50 MHz) transducer array comprises a PZT substrate (Motorola 3203HD) having a thickness of approximately 47 μm. An electrode layer of Cr—Au about 1000 Å thick is deposited on the first face of the substrate. An electrode layer of aluminum about 2 μm thick is deposited on the second face. The second face or electrode is patterned using photolithography to define the array geometry as shown in FIG. 3, which figure depicts an electrode pattern suitable for a 50 MHz annular array. A matching layer of silver epoxy at a thickness of approximately 9 μm is applied to the first face of the array. Electrical connections are made to the array elements and a backing layer of tungsten-loaded epoxy (EPO-TEK 301-2), at a thickness of approximately 1 mm, is applied to the second face of the array.

The performance of several embodiments of a 50 MHz kerfless annular array was evaluated using a finite element model (FEM) (PZFlex, Weidlinger Associates, CA.) of the arrays. The software has been shown to accurately model the electrical and mechanical response of a transducer [3-9], including non-idealized behaviour such as mechanical or electrical coupling between elements and unwanted vibrational modes. Three performance parameters were investigated: 1) the pulse shape, which is important for axial resolution, 2) the electrical impedance of the array elements, which is important for electronics design, and 3) the radiation pattern, which defines the lateral resolution and image contrast. The radiation pattern from the finite element analysis was compared to the ideal radiation pattern for each array. The ideal radiation pattern was generated using the impulse-response method reported by Arditi et al. [10]. Arditi derived analytical expressions for the impulse response of an annular array based on the array geometry. The radiation pattern is calculated by convolving the impulse response at each location in the field with a pulse representing the normal particle velocity at the surface of the array. The resulting radiation pattern is used as the ideal pattern because the entire array is assumed to vibrate in an ideal piston (i.e., single) mode with no electrical and mechanical coupling between the array elements. By comparing the ideal radiation and the radiation pattern from the FEM, the effect of non-ideal vibration modes and coupling between elements can be determined.

Figure 4:
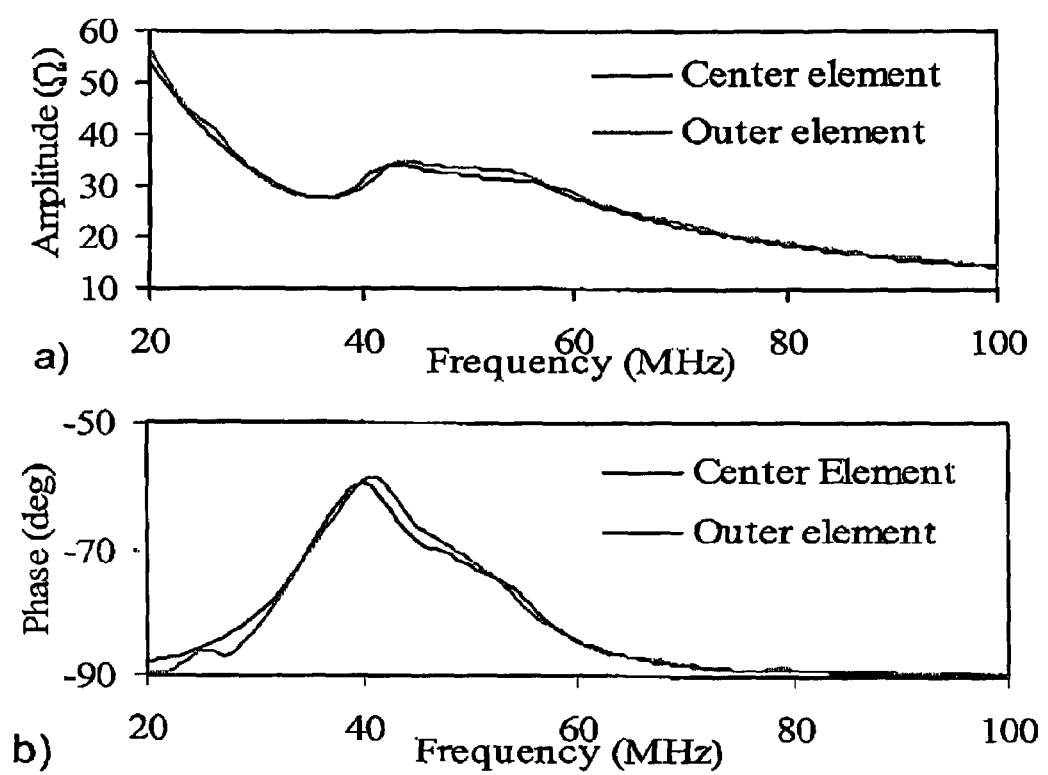
FIG. 4 shows the impedance response (a) amplitude and (b) phase of the central and outermost elements of a 7 element kerfless annular array.
Figure 5:
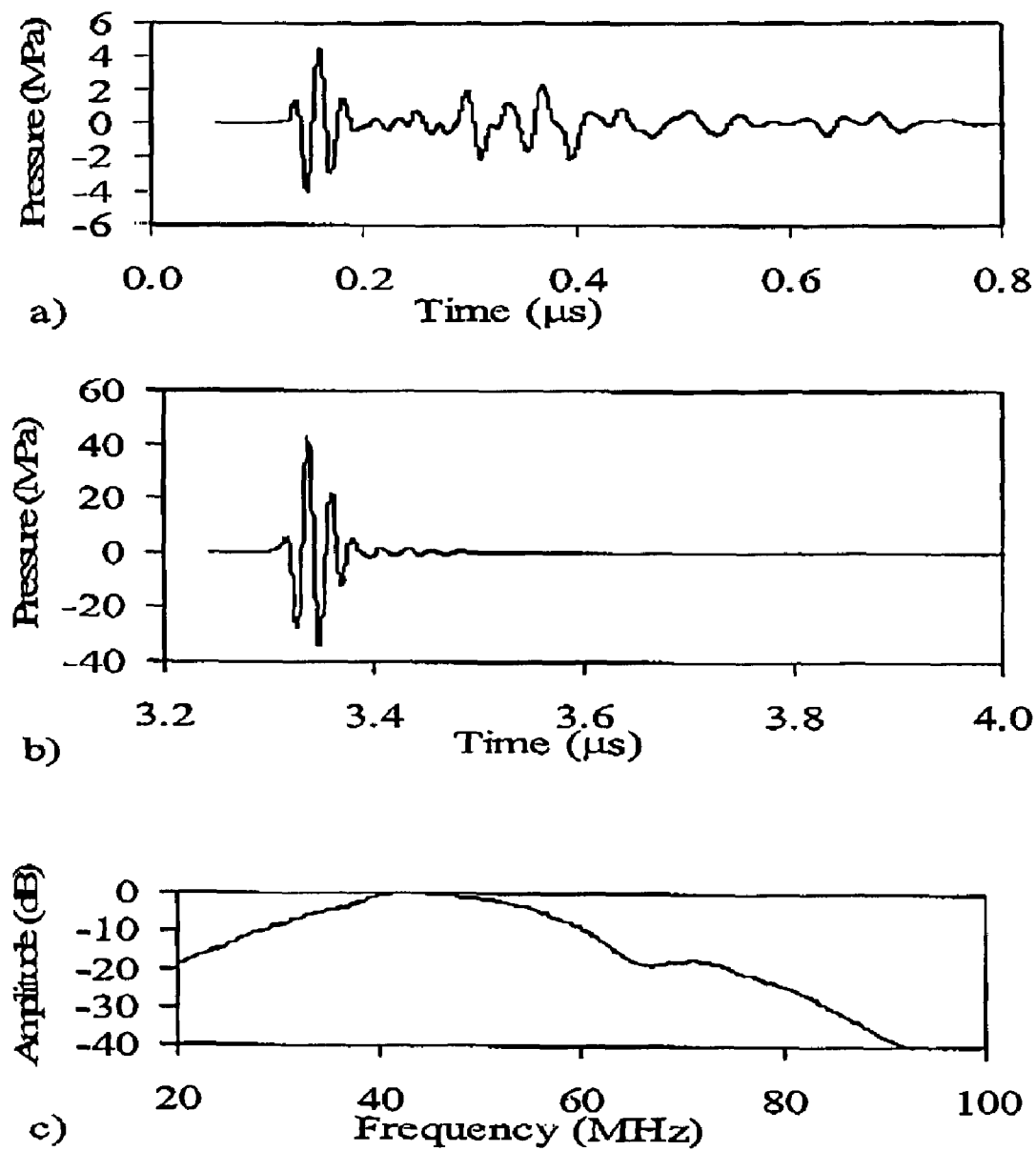
FIG. 5 shows the pulse on-axis at (a) 0.1 mm and (b) 5 mm from the transducer and (c) spectrum of the pulse at 5 mm, for a 7 element kerfless annular array.
Figure 6:
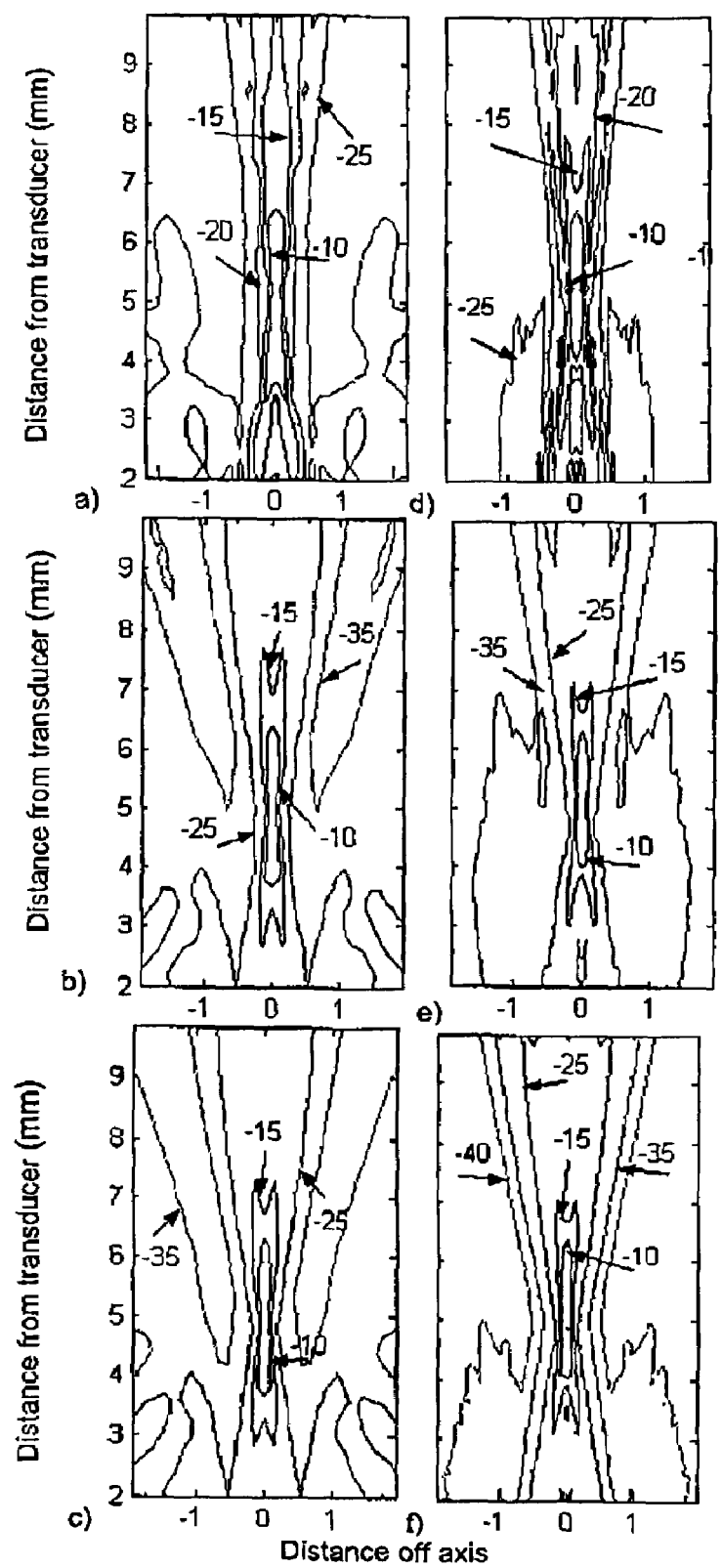
FIG. 6 shows one-way radiation patterns of a focussed transducer using (a to c) finite element models and (d to f) electrically and acoustically isolated elements, of an annular array with (from top) 5, 7, and 10 elements.

The results of the modelling are summarized in FIGS. 4 to 6. The magnitude and phase of the electrical impedance for the central element and outer element of a 7 element kerfless annular array are shown in FIG. 4. The electrical impedance for the two elements is remarkably similar, and very flat over the bandwidth of interest from 40 to 60 MHz. The impedance shows no evidence of lateral modes even though the width of the outer electrode (64 μm) is similar to the thickness of the transducer substrate (47 μm).

FIG. 5a shows the pulse very close (0.1 mm) to the face of the 7 element array. The elements were excited using a monocycle 50 MHz impulse. Appropriate time delays were introduced to focus the beam at 5 mm. The resulting acoustic pulse is longer than desired. Since the elements are not mechanically isolated, energy is coupled freely through the transducer substrate and a long (e.g., more than 5 cycles) ringing pulse is produced. However, the pulse at the focal region, shown in FIG. 5b, is very different. At the focal region, only the thickness mode vibrations are correlated and consequently, the long tail in the pulse is almost entirely eliminated. The pulse spectrum at the focal region, shown in FIG. 5c, is centred at approximately 45 MHz with a -6 dB bandwidth of 55%.

The one-way radiation patterns for 5, 7, and 10 element annular arrays are shown in FIG. 6. Two radiation patterns are shown for each array geometry, one representing the finite element prediction (left) and the other the ideal response (right). In each case the array was focused at 5 mm (f/2.5). The radiation patterns are plotted as contour plots in dB normalized to the peak pressure. The FEM and ideal radiation patterns are very similar. Both radiation patterns show significant improvement in suppression of off-axis energy with increasing number of elements. However, the positive effect of increasing the number of elements is less in the FEM radiation pattern than in the ideal pattern. This shows that the relative importance of coupling between elements increases with increasing number of elements. However, for an array with less than 10 elements, coupling between elements in a kerfless design does not appear to be the limiting factor.

EXAMPLE 2

Figure 7:
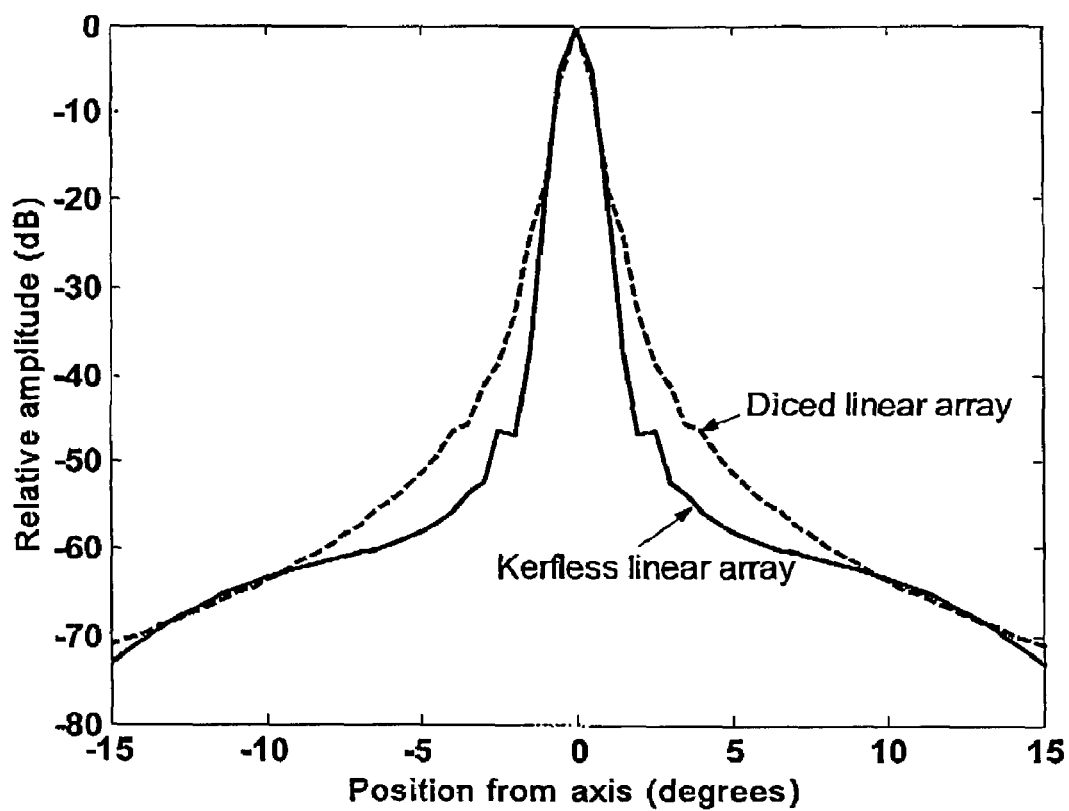
FIG. 7 shows relative amplitude of the 2-way radiation pattern at a 5 mm radius from a 64 element, 50 MHz kerfless linear array (solid line) and diced linear array (dashed line), focussed to 5 mm.

The performance of 50 MHz kerfless and sub-diced arrays was evaluated using finite element modeling (PZFlex, Weidlinger Associates, Calif.). Both arrays had 64 elements, 30 μm element spacing, a single front quarter-wavelength matching layer, and a high loss, high impedance backing layer. No kerf filler was used for the diced array and each element was sub-diced once to suppress lateral modes. The -6 dB width of the directivity (single element) calculated at a 5 mm radius was 16 degrees for the kerfless array, compared with 72 degrees for the sub-diced array. Cross-talk between adjacent elements was -7.5 dB for the kerfless array, and -28 dB for the sub-diced array. As shown in FIG. 7, the radiation pattern (5 mm focal distance) had a -6 dB width of 1.5 degrees for both arrays. At an angle of 7.5 degrees, the radiation pattern was below -60 dB for both arrays. The pulse shape and pulse amplitude at the focal region were remarkably similar for both arrays.

The finite element model predictions were verified experimentally using a lower frequency (2.0 MHz) kerfless linear array. The array had 24 elements with 670 μm center-to-center element spacing. The elements were defined by evaporating a chrome-gold electrode through a thin stainless steel mask onto the back surface of 1.0 mm thick PZT5H disk. A gap approximately 150 μm wide was used to separate adjacent electrodes. A continuous electrode was evaporated on the top surface of the ceramic and a thin layer of tungsten-loaded epoxy was cast onto the front surface and lapped to thickness corresponding to a quarter of a wavelength at 2 MHz. Electrical connections were then made to individual electrodes on the back surface and a 2 cm thick backing layer of tungsten loaded epoxy was applied. The array was tested in a water bath by recording the reflections from a line target placed a fixed distance in front of the array, oriented at 90 degrees to the array elements. The radiation pattern of individual array elements was measured by scanning the array across the target and recording the maximum amplitude of the reflected signal as a function of position. Good agreement was obtained between the model predictions and the experimental results. Thus, the results indicate that kerfless linear arrays can be produced with little or no degradation of the radiation pattern compared to a conventional diced array.

EXAMPLE 3

Figure 8:
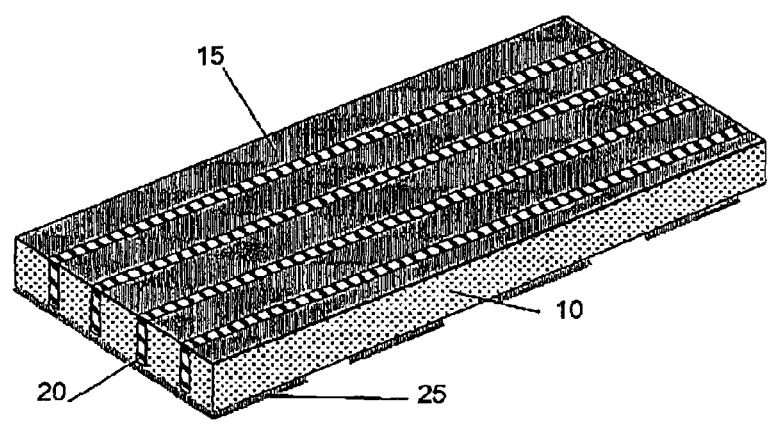
FIG. 8 is a schematic diagram showing a perspective view of a linear-linear phased array according to an embodiment of the invention.

A hybrid linear-linear phased array is shown schematically in FIG. 8, based on a substrate 10, where the phased array portion is a conventional diced array with half-wavelength spacing and a kerf filler 20 between elements, and with the electrodes 15 on the top face of the transducer. On the bottom face of the transducer, electrodes 25 are patterned perpendicular to those of the phased array, creating a kerfless linear array.

The hybrid array is made from the same materials as described previously (e.g., PZT substrate, chrome-gold electrodes, tungsten-loaded epoxy backing layer, one or more polymer matching layers), and the geometry of the elements is preferably rectangular. The linear phased array elements has an aspect ratio (height/width) of at least 2 to avoid coupling unwanted lateral modes into the bandwidth of the array. The linear array elements have about ½ to about 2 wavelength spacing, with a gap of about 5% to about 30% of the element width between adjacent electrodes, and the length of the array elements ranges from about 16 to about 200 wavelengths. The impedance of the elements is similar to a conventional array, assuming similar element size. The pulse shape and bandwidth of such a hybrid array are similar to what could be achieved using a conventional array, for example, about 40% to 100% factional bandwidth. Preferably, the array provides a narrow main beam, with secondary lobes less than −60 dB with respect to the main lobe.

According to this embodiment, a single element is activated by setting one electrode to ground and placing a signal on an opposing electrode. If all the other electrodes are allowed to 'float', an acoustic pulse is only emitted from the region where the grounded and active electrodes overlap.

Figure 9:
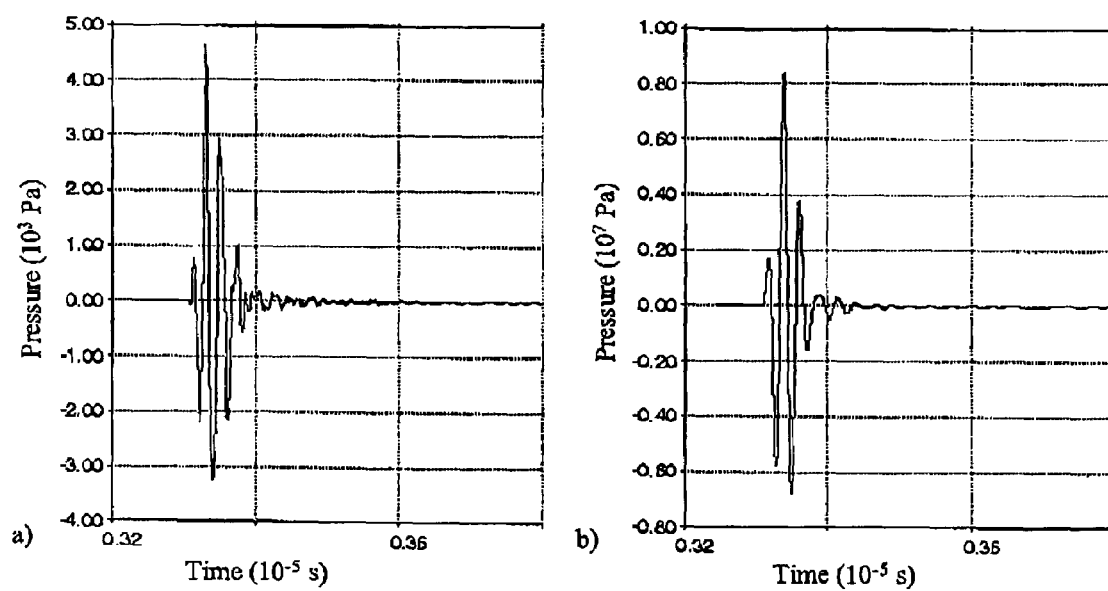
FIG. 9 shows pulses at 5 mm from an annular array with the central element excited, and opposing electrode (a) allowed to float and (b) set to ground

Preliminary tests of a such transducer with floating electrodes have been performed using a finite element model (FEM). One electrode of an array was excited, and the opposing, normally grounded electrode was allowed to float. Pulses at a distance of 5 mm in front of the array from a non-grounded and a grounded transducer are shown in FIG. 9. The amplitude of the pulse excited using a floating electrode was 3 orders of magnitude smaller. Therefore, the acoustic signal emitted from a non-grounded element has minimal effect on the acoustic signal resulting from an excited element with one electrode set to ground.

Figure 10:
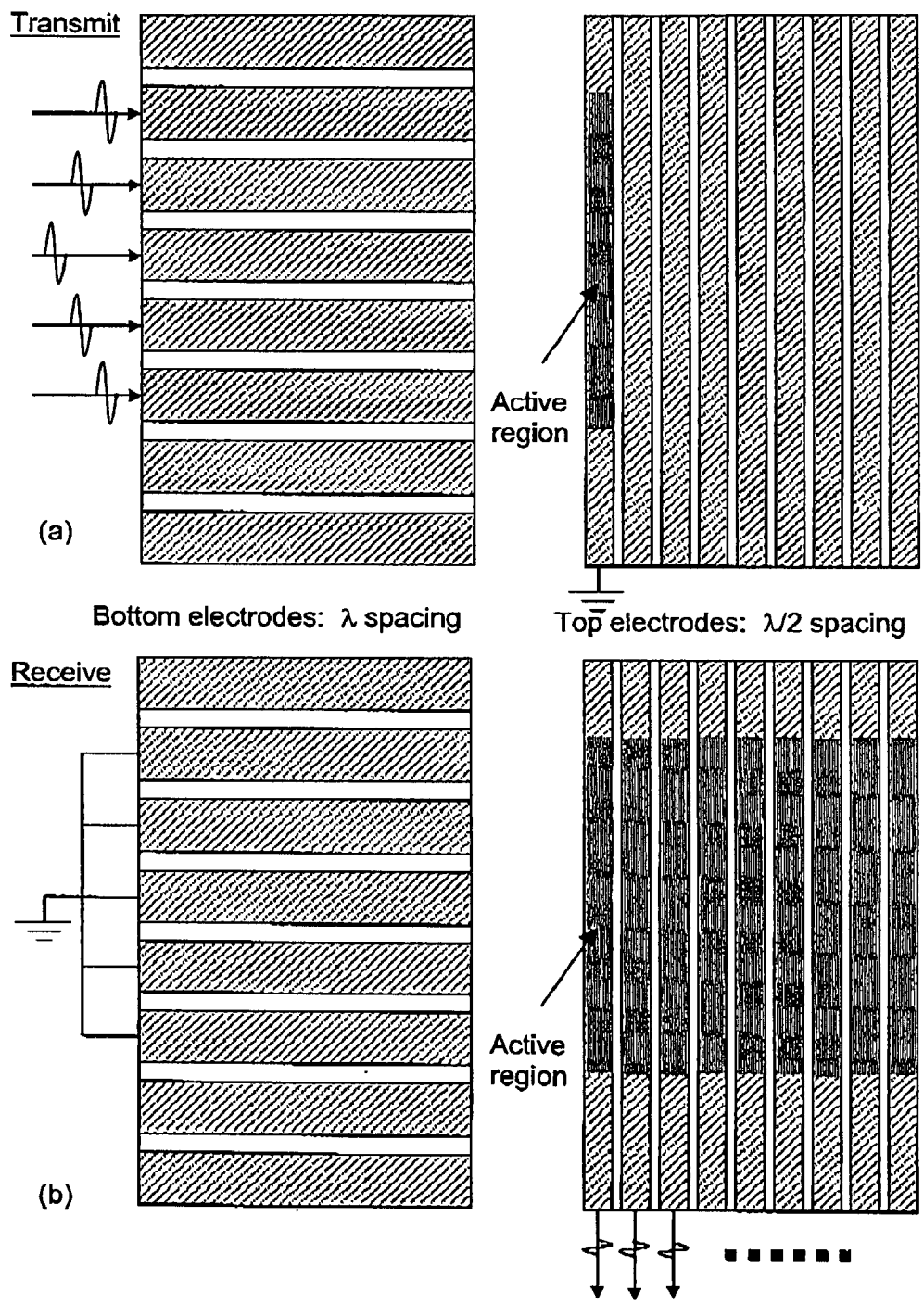
FIG. 10 is a schematic diagram of a section of a linear-linear phased array transducer according to an embodiment of the invention, showing top and bottom electrode configurations for (a) transmit and (b) receive sequences.

A linear-linear phased array can create one 2-D slice of a 3-D image in a similar manner to a linear phased array. An example of the sequence of transmit and receive events with a linear-linear phased array is shown in FIG. 10. To transmit a pulse, one of the edge electrodes of the phased array is set to ground, while a subset of the linear array electrodes is excited with appropriate delays to focus the pulse over the desired depth. To receive a signal, the linear array electrodes that had just been driven are set to ground, and the electrical signals resulting from the reflected ultrasound pulse are taken from the phased array electrodes. As for the 1-D phased array, 3 to 5 transmit events are used, and the image is created using synthetic aperture beamforming. Alternatively, the image could be formed using multiple simultaneous transmit beams and synthetic aperture beamforming. Those of ordinary skill in the art will appreciate that many other configurations, including other combinations of elements excited and set to ground, are possible.

Figure 11:
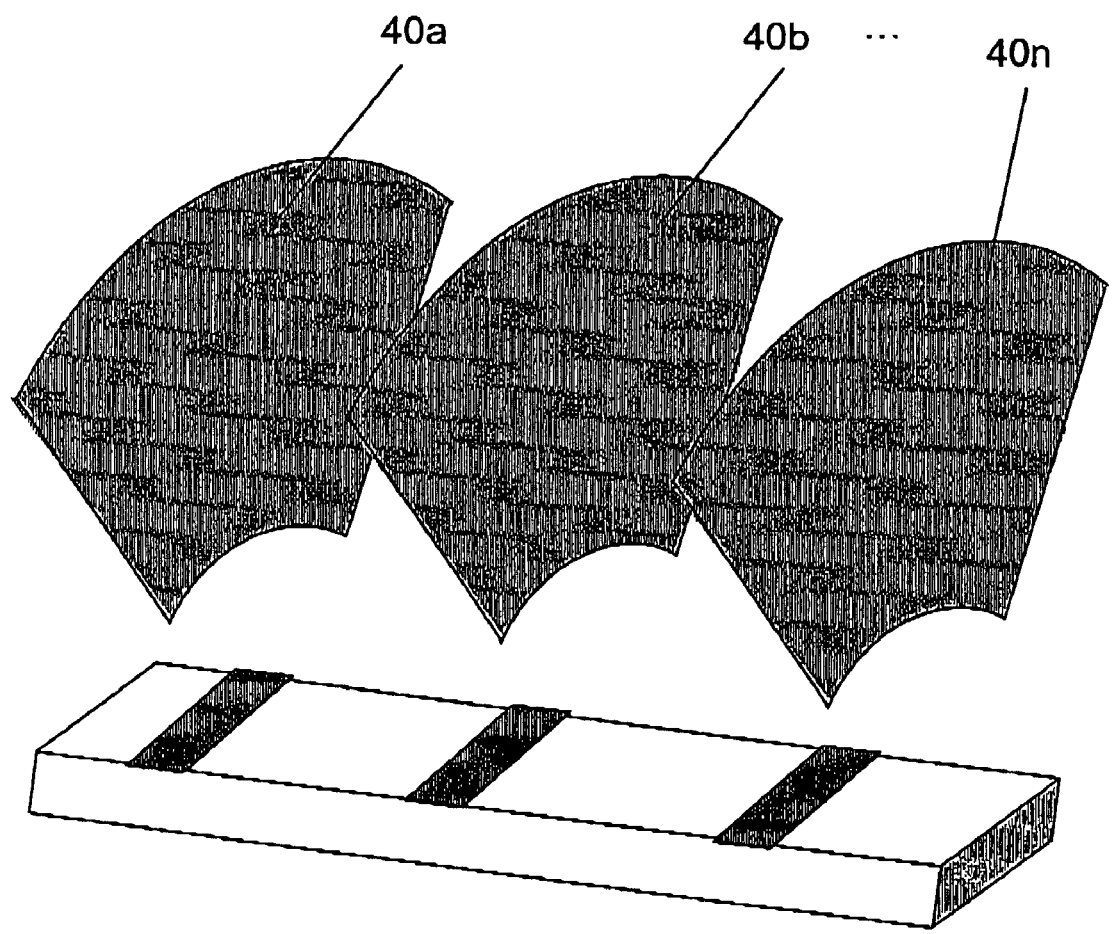
FIG. 11 is a schematic diagram illustrating how a transducer can image a volume by taking many sector scans.

The full 3-D image from a linear-linear phased array is acquired using linear array beamforming techniques. A subset of the linear array elements is activated, creating a 1-D linear phased array in one region which images a slice of the tissue. The subset of linear array electrodes activated is shifted to create many (i.e., "n") sequential, spatially adjacent sector format slices (i.e., 2-D images), denoted by reference numerals 40*a* to 40*n* in FIG. 11. The n sector format slices are assembled to make a 3-D image. The number of 2-D images required to produce a 3-D image will depend on each particular situation, including system constraints such as amount of memory available for image storage and manipulation of the data. Practically, a 3-D image can be produced from as few as 20 2-D images, or as many as 200 2-D images. It should be noted that by repeating this process using different subsets of the linear array elements, synthetic aperture beamforming can also be used to focus the ultrasound beam in the elevation direction.

An advantage of a linear-linear phased array over a full 2-D array for real-time 3-D imaging is that a 128×128 linear-linear phased array has only 256 elements, while a full 2-D array has over 16,000 elements. Consequently, the amount of electronics required can be greatly reduced for the same image quality. Because the linear-linear phased array elements are much larger than those of the 2-D array, the impedance is much lower, and electrical matching simplified. Further, using the linear array to focus the transmit pulse in the third dimension for each image slice eliminates the need to mechanically move the transducer to image the third dimension, reducing noise and the overall size of the transducer head.

Equivalents

Those skilled in the art will recognize or be able to ascertain, using no more than routine experimentation, variants of the embodiments disclosed herein. Such variants are understood to be within the scope of the invention and are covered by the appended claims.

References

1. G. F. Guesse, C. G. Oakley, S. J. Douglas, R. D. Morgan, "Cross-talk Paths in Array Transducers," *Proc. 1995 IEEE Ultrasonic Symp.*, vol. 2, 1279–1282, 1995.
2. P. A. Payne, J. V. Hatfield, A. D. Armitage, Q. X. Chen, P. J. Hicks and N. Scales, "Integrated Ultrasound Transducers," *Proc. 1994 IEEE Ultrasonics Symp*, vol. 2, 1523–1526, 1994.
3. G. L. Wojcik, D. K. Vaughn, N. Abboud, and J. Mould, Jr. "Electromechanical modeling using explicit time-domain finite elements," *Proc. 1993 IEEE Ultrasonic Symp.*, vol. 2, 1107–1112, 1993.
4. G. L. Wojcik, D. D. Vaughn, V. Murray, and J. Mould, Jr., "Time-domain modeling of composite arrays for underwater imaging," *Proc. 1994 IEEE Ultrasonic Symp.*, vol. 2, 1027–1032, 1994. ," *Proc. 1996 IEEE Ultrasonic Symp.*, vol. 2, 1509–1512, 1996
5. G. Wojcik, J. Mould, Jr., F. Lizzi, N. Abboud, M. Ostromogilsyk, and D. Vaughn, "Nonlinear modeling of therapeutic ultrasound," *Proc. 1995 IEEE Ultrasonic Symp.*, vol. 2, 1617–1622, 1995.
6. D. M. Mills, and S. W. Smith, "Combining multi-layers and composites to increase SNR for medical ultrasound transducers," *Proc. 1996 IEEE Ultrasonic Symp.*, vol. 2, 1509–1512, 1996.
7. D. J. Powell, G. L. Wojcik, C. S. Desilets, T. R. Gururaja, K. Guggenberger, S. Sherrit, and B. K. Mukherjee, "Incremental 'model-build-test' validation exercise for a 1-D biomedical ultrasonic imaging array," *Proc. 1997 IEEE Ultrasonic Symp.*, vol. 2, 1669–1674, 1997.
8. R. L. Goldberg, M. J. Jurgens, D. M. Mills, C. S. Henriquez, D. Vaughn, and S. W. Smith, "Modeling of piezoelectric multiplayer ceramics using finite element analysis," *IEEE Trans. Ultrason., Ferroelect., Freq. Contr.*, vol. 44, no. 6, 1204–1213, 1997.
9. N. N. Abboud, G. L. Wojcik, D. K. Vaughn, J. Mould, D. J. Powell, and L. Nikodym, "Finite Element Modeling for Ultrasonic Transducers", *SPIE Int. Symp. Medical Imaging*, Vol. 3341 p. 19–42, 1998.

10. M Arditi, F. S. Foster, and J. W. Hunt, "Transient fields of cancave annular arrays", Ultrasonic Imaging, Vol. 3, pp. 37–61, 1981
11. G. Stetten and R. Tamburo, "Real-time Three-Dimensional Ultrasound Methods for Shape Analysis and Visualization," *Methods,* vol. 25, 221–230, 2001.
12. G. R. Lockwood, P. C. Li, M. O'Donnel, and F. S. Foster, "Optimizing the Radiation Pattern of Sparse Periodic Linear Arrays," *IEEE Trans. Ultrason., Ferroelect., Freq. Contr.,* vol. 43, no. 1, 7–14, 1996.
13. S. W. Smith, H. G. Pavy, Jr., and O. T. von Ramm, "High-Speed Ultrasound Volumetric Imaging System—Part I: Transducer Design and Beam Steering," *IEEE Trans. Ultrason., Ferroelect., Freq. Contr.,* vol. 38, no. 2, 100–108, 1991
14. O. T. von Ramm, S. W. Smith, and H. G. Pavy, Jr., "High-Speed Ultrasound Volumetric Imaging System—Part II: Parallel Processing and Image Display," *IEEE Trans. Ultrason., Ferroelect., Freq. Contr.,* vol. 38, no. 2, 109–115, 1991.

We claim:

1. A transducer for transmitting and/or receiving ultrasound energy, comprising:
   a hard substrate having first and second opposed faces;
   a first electrode disposed on said first substrate face, said first electrode comprising an array of electrode elements and lacking grooves in the substrate between electrode elements; and
   a second electrode disposed on said second substrate face, said second electrode comprising an array of electrode elements and having grooves in the substrate between electrode elements.

2. The transducer of claim 1, wherein said arrays of elements on said first and second substrate faces have different patterns.

3. The transducer of claim 1, wherein said first electrode on the first substrate face comprises a linear array and said second electrode on the second substrate face comprises a linear phased array.

4. The transducer of claim 1, wherein said substrate is of a material selected from piezoelectric ceramic, ferroelectric ceramic, and single crystal relaxor ferroelectric material.

5. The transducer of claim 1, wherein said substrate is of PZT material.

6. The transducer of claim 1, further comprising at least one matching layer disposed on at least one of said first and second electrodes.

7. An ultrasonic imaging system comprising the transducer of claim 1 and ultrasound transmitting and receiving circuitry.

8. The system of claim 7 further comprising means for processing signal information.

9. A method for producing a transducer for transmitting and/or receiving ultrasound energy, comprising:
   providing a hard substrate having first and second opposed faces;
   disposing a first electrode on said first substrate face, said first electrode comprising an array of electrode elements and lacking grooves in the substrate between electrode elements; and
   disposing a second electrode on said second substrate face, said second electrode comprising an array of electrode elements and having grooves in the substrate between electrode elements.

10. A method for producing a 3-D ultrasound image of a material under investigation, comprising:
   (a) providing a transducer for transmitting and receiving ultrasound energy which includes a hard substrate having first and second opposed faces, a first electrode disposed on said first substrate comprising an array of electrode elements and lacking grooves in the substrate between the electrode elements and a second electrode disposed on said second substrate face comprising an array of electrode elements and having grooves in the substrate between electrode elements, and where said first electrode on the first substrate face comprises a linear array and said second electrode on the second substrate face comprises a linear phased array,
   (b) activating a first subset of said linear array elements to create a first 2-D image;
   (c) activating a second subset of said linear array elements to create a second 2-D image, wherein said second image is spatially adjacent to said first 2-D image;
   (d) repeating steps (b) and (c) n times to create n spatially adjacent 2-D images; and
   (e) assembling said n 2-D images to produce a 3-D image of said material under investigation.

11. The method of claim 10, wherein the material under investigation is biological tissue.

12. The method of claim 11, wherein the biological tissue is cardiac tissue.

13. A method for transmitting and/or receiving ultrasound energy, comprising providing a hard substrate having first and second opposed faces;
   disposing a first electrode on said first substrate face, the first electrode comprising a first array of electrode elements, said first array of electrode elements lacking grooves in the substrate between electrode elements;
   disposing a second electrode on said second substrate face, the second electrode comprising a second array of electrode elements, said second array of electrode elements lacking grooves in the substrate between electrode elements; and
   focusing electronically said first array of electrode elements at a fixed steering angle to transmit and/or receive ultrasound energy and focusing electronically said second array of electrode elements at a fixed steering angle to transmit and/or receive ultrasound energy.

14. A method for producing an ultrasound image of a material under investigation, comprising
   transmitting at least one ultrasonic pulse into a material under investigation and receiving an echo of said at least one pulse using the method of claim 13; and
   processing information corresponding to said pulse and said echo to generate an image of said material.

15. The method of claim 14, wherein the material under investigation is biological tissue.

16. The method of claim 15, wherein the biological tissue is cardiac tissue.

17. The method of claim 13, wherein providing a hard substrate comprises providing a substrate of a material selected from piezoelectric ceramic, ferroelectric ceramic, single crystal relaxor ferroelectric material, and composite transducer materials.

18. The method of claim 13, wherein providing a hard substrate comprises providing a substrate of PZT material.

19. The method of claim 13, wherein providing a hard substrate comprises providing a substrate selected from PZN-PT and PMN-PT material.

20. The method of claim 13, further comprising disposing at least one matching layer on said second electrode.

21. The method of claim 13, further comprising disposing at least one silver epoxy matching layer on said second electrode.

22. The method of claim 13, wherein said second electrode is also a matching layer.

23. The method of claim 13, further comprising disposing at least one backing layer on said first electrode.

24. The method of claim 13, further comprising disposing at least one tungsten-loaded epoxy backing layer on said first electrode.

25. The method of claim 13, wherein disposing said first electrode comprises providing an array of electrode elements in an array pattern selected from annular, linear, curved linear, 1.5-D, and 2-D.

26. The method of claim 13, further comprising providing, for said a second array of electrode elements on the second substrate face, grooves in the substrate between electrode elements.

27. The method of claim 13, wherein said first and second arrays of electrode elements on said first and second electrodes have different patterns.

28. A method for producing an ultrasound image of a material under investigation, comprising:
   transmitting at least one ultrasonic pulse into a material under investigation and receiving an echo of said at least one pulse using the method of claim 13; and
   processing information corresponding to said pulse and said echo to generate an image of said material.

29. The method of claim 28, wherein the material under investigation is biological tissue.

30. The method of claim 29, wherein the biological tissue is cardiac tissue.

31. A method for producing a 3-D ultrasound image of a material under investigation, comprising:
   (a) providing a transducer comprising a substrate having first and second opposed faces, said first opposed substrate face comprising an electrode having a first array of electrode elements, and said second opposed substrate face comprising an electrode having a second array of electrode elements, said first and second arrays of electrode elements lacking grooves in the substrate between electrode elements;
   (b) focusing electronically a subset of said first array of electrode elements at a fixed steering angle to transmit an ultrasound signal into the material under investigation;
   (c) receiving an ultrasound signal from the material under investigation using said second array of electrode elements;
   (d) processing the signal received in (c) to produce a 2-D image;
   (e) repeating steps (b) to (d) n times to create n spatially adjacent 2-D images; and
   (e) assembling said n 2-D images to produce a 3-D image of said material under investigation.

32. The method of claim 31, wherein the material under investigation is biological tissue.

33. The method of claim 32, wherein the biological tissue is cardiac tissue.

* * * * *